United States Patent
Hsu

(10) Patent No.: US 7,984,366 B2
(45) Date of Patent: Jul. 19, 2011

(54) EFFICIENT CHIEN SEARCH METHOD IN REED-SOLOMON DECODING, AND MACHINE-READABLE RECORDING MEDIUM INCLUDING INSTRUCTIONS FOR EXECUTING THE METHOD

(75) Inventor: Yueh-Teng Hsu, Taipei (TW)

(73) Assignee: Lite-On Technology Corp., Taipei (TW)

( * ) Notice: Subject to any disclaimer, the term of this patent is extended or adjusted under 35 U.S.C. 154(b) by 1007 days.

(21) Appl. No.: 11/839,045

(22) Filed: Aug. 15, 2007

(65) Prior Publication Data

US 2008/0320371 A1    Dec. 25, 2008

(30) Foreign Application Priority Data

Jun. 23, 2007    (TW) ............................... 96122733 A

(51) Int. Cl.
*H03M 13/00*    (2006.01)
(52) U.S. Cl. ........................ 714/784; 714/774
(58) Field of Classification Search .................. 714/784, 714/774
See application file for complete search history.

(56) References Cited

U.S. PATENT DOCUMENTS

| 6,092,233 | A  | * | 7/2000  | Yang ............................. 714/784 |
| 6,263,470 | B1 |   | 7/2001  | Hung et al. |
| 6,360,348 | B1 | * | 3/2002  | Yang ............................. 714/784 |
| 6,460,160 | B1 | * | 10/2002 | Classon ........................ 714/791 |
| 6,487,691 | B1 | * | 11/2002 | Katayama et al. ............ 714/784 |

* cited by examiner

*Primary Examiner* — M. Mujtaba K Chaudry
(74) *Attorney, Agent, or Firm* — Rosenberg, Klein & Lee

(57) ABSTRACT

An efficient Chien search method in Reed-Solomon decoding is adapted to be implemented in a processor having a parallel processing instruction set. The method includes the following steps: (a) calculating an error evaluation value; (b) subjecting the error evaluation value to mapping processing so as to find an index adjusting value; (c) storing a symbol index into an error location memory corresponding to a location index; (d) updating the location index according to the index adjusting value; (e) updating the symbol index; and (f) repeating steps (a) to (e) a particular number of times. The method primarily aims to reduce program flow branching so as to enhance the computation efficiency of the Chien search process.

10 Claims, 4 Drawing Sheets

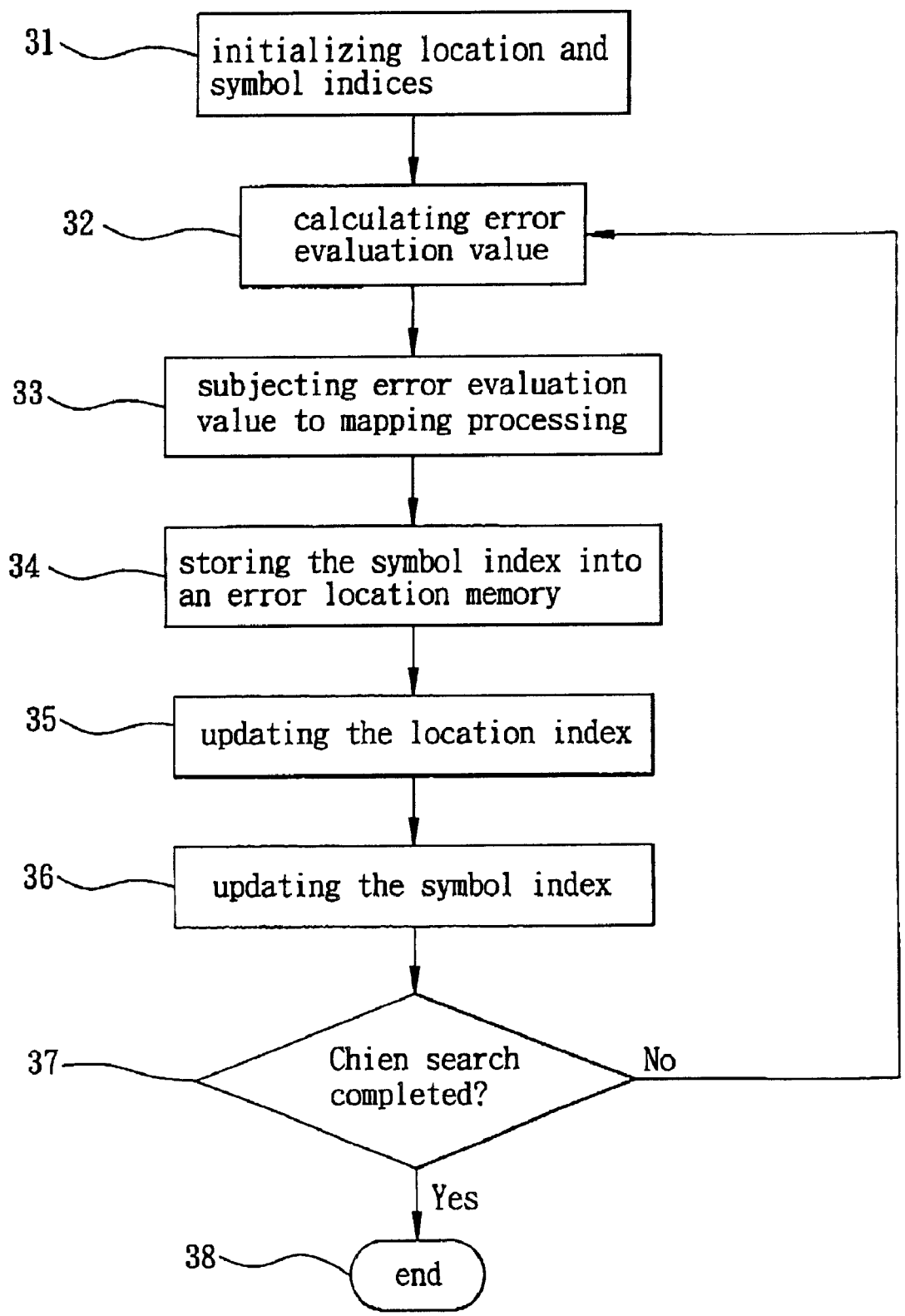
F I G. 3

EFFICIENT CHIEN SEARCH METHOD IN REED-SOLOMON DECODING, AND MACHINE-READABLE RECORDING MEDIUM INCLUDING INSTRUCTIONS FOR EXECUTING THE METHOD

CROSS-REFERENCE TO RELATED APPLICATION

This application claims priority of Taiwanese Application No. 096122733, filed on Jun. 23, 2007.

BACKGROUND OF THE INVENTION

1. Field of the Invention

The invention relates to a Chien search method in Reed-Solomon decoding, more particularly to a Chien search method in Reed-Solomon decoding, which can reduce program flow branching so as to enhance efficiency, and to a machine-readable recording medium including a plurality of instructions for executing the method.

2. Description of the Related Art

In recent years, demand for reliable signal transmission with respect to products ranging from consumer electronic products to communications electronic products has increased considerably. Therefore, error detection and correction mechanisms are becoming more and more important. During the process of digital communication, to ensure the accuracy of source data to be transmitted, a transmitting end generally will append redundant data to the source data, so that the receiving end can perform error correction based on the redundant data. The Reed-Solomon code is a widely used correction code. Since the Reed-Solomon code has a good correction capability with respect to errors generated in transmission channels, it has become a very popular channel coding scheme, and is now a widely used error correction code in satellite communication systems, digital television systems, various digital audiovisual recording media, etc.

Even though the Reed-Solomon code has excellent performance in error correction, the amount of computations required for decoding is huge. Consequently, hardware is often used for calculation and processing. If the Reed-Solomon code is executed in a processor in the form of program decoding, the decoding speed will inevitably become extremely slow due to the huge computation amount. Therefore, in some applications of communications devices with software-defined operations (such as software defined radio (SDR)), accelerating the program decoding speed of the Reed-Solomon code has become an important subject of research.

Referring to FIG. 1, an existing Reed-Solomon decoding procedure can be divided into four stages, which are, as shown, a stage 11 of calculating syndromes, a stage 12 of calculating error location polynomials, a stage 13 of executing a Chien search, and a stage 14 of calculating error values. In this Reed-Solomon decoding procedure, about 40% of the computation amount is concentrated on the Chien search at stage 13. If the processing time for executing the Chien search can be effectively reduced, the decoding speed of the Reed-Solomon code can be successfully accelerated.

Referring to FIG. 2, a conventional Chien search method in Reed-Solomon decoding includes the following steps. In step 21, a location index j and a symbol index i are initialized, i.e., j=0, and i=0. In step 22, an error evaluation value $\Lambda(\alpha^i)$ is calculated. In step 23, a decision is performed to determine if the error evaluation value $\Lambda(\alpha^i)$ is equal to 0. If yes, this indicates that an error occurs in a symbol at the $i^{th}$ position, and step 24 is carried out to perform the necessary processing. Otherwise, the flow goes to the processing in step 26. In steps 24 and 25, the current symbol index i is first stored in an error location array, Location[j]=1, followed by incrementing the location index, j=j+1. In steps 26-28, a decision is performed to determine if the Chien search has been completed, i.e., determining if i=n−1. If yes, the Chien search is ended. Otherwise, the symbol index i is incremented, i=i+1, and the aforesaid steps 22-26 are repeated. In steps 24-25, n represents a total number of symbols of a Reed-Solomon block code that was received.

The determination processing in step 23 of the aforesaid conventional method will generate program flow branching. That is, one operation (step 24) will be executed when $\Lambda(\alpha^i)=0$, and another operation (step 26) will be executed when $\Lambda(\alpha^i)\neq 0$. Branching will result in disordered execution of a processor, causing a reset of internal instructions and data of a pipeline of the processor, thereby affecting the overall efficiency of the processor adversely.

Other conventional Chien search schemes in the Reed-Solomon code, such as those disclosed in U.S. Pat. No. 6,263,470 and U.S. Pat. No. 6,360,348, are primarily concerned with the acceleration of the computation of the Chien search process using look-up tables, and are silent on the problem of program flow branching associated with the Chien search process.

Therefore, there is a need for a solution to reduce the program flow branching in the aforesaid conventional method, so that the processing time of the Chien search can be further reduced to thereby increase the decoding speed of the Reed-Solomon code.

SUMMARY OF THE INVENTION

Therefore, an object of the present invention is to provide an efficient Chien search method in Reed-Solomon decoding, which is adapted to be implemented in a processor having a parallel processing instruction set.

Accordingly, the efficient Chien search method in Reed-Solomon decoding of the present invention includes the following steps: (a) calculating an error evaluation value; (b) subjecting the error evaluation value to mapping processing so as to find an index adjusting value; (c) storing a symbol index into an error location memory corresponding to a location index; (d) updating the location index according to the index adjusting value; (e) updating the symbol index; and (f) repeating steps (a) to (e) a particular number of times.

Another object of the present invention is to provide a machine-readable recording medium adapted for execution of the efficient Chien search method in Reed-Solomon decoding.

Accordingly, the machine-readable recording medium of the present invention includes a plurality of instructions. The instructions are used to execute the following steps in a processor having a parallel processing instruction set: (a) calculating an error evaluation value; (b) subjecting the error evaluation value to mapping processing so as to find an index adjusting value; (c) storing a symbol index into an error location memory corresponding to a location index; (d) updating the location index according to the index adjusting value; (e) updating the symbol index; and (f) repeating steps (a) to (e) a particular number of times.

The present invention allows for a further reduction in the processing time of the Chien search process by reducing program flow branching in the Chien search, thereby enhancing the decoding speed of the Reed-Solomon code.

BRIEF DESCRIPTION OF THE DRAWINGS

Other features and advantages of the present invention will become apparent in the following detailed description of the preferred embodiment with reference to the accompanying drawings, of which:

FIG. 3 is a flowchart to illustrate a preferred embodiment of an efficient Chien search method in Reed-Solomon decoding according to the present invention.

DETAILED DESCRIPTION OF THE PREFERRED EMBODIMENT

Figure 1:
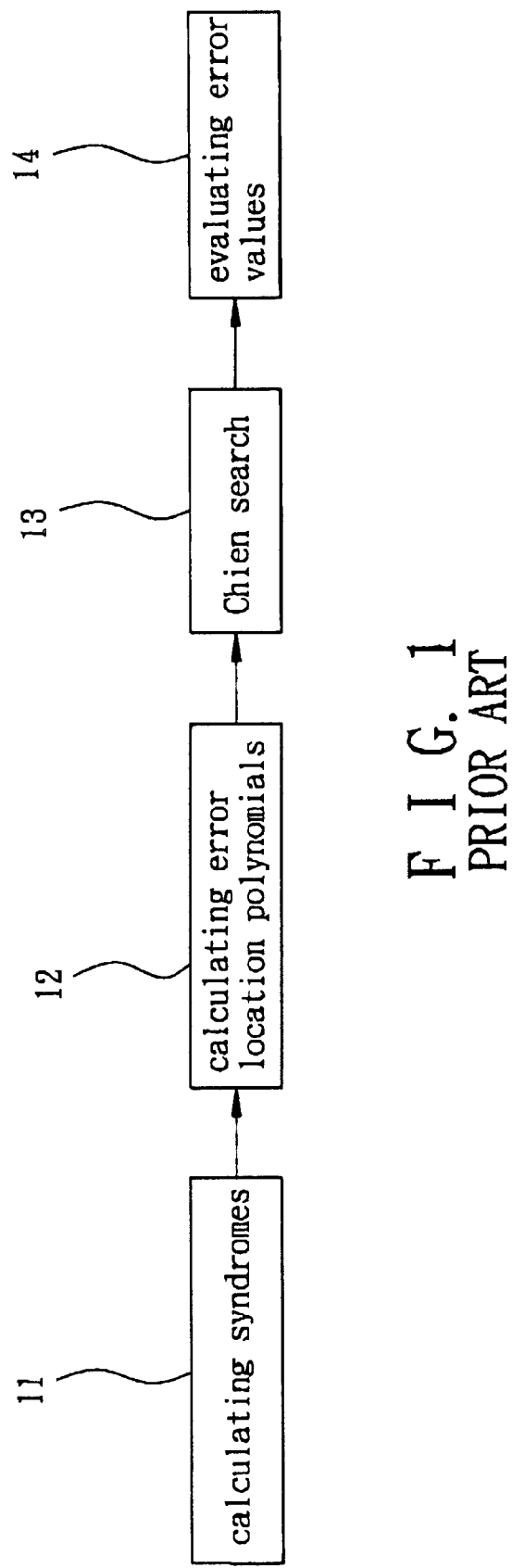
FIG. 1 is a flow diagram to illustrate a conventional Reed-Solomon decoding procedure.

Referring back to FIG. 1, as mentioned hereinbefore, the Reed-Solomon decoding procedure includes stages 11, 12, 13, and 14. In stage 11, the purpose of calculating syndromes is to determine if the received signal has been contaminated by noise. If the result of syndrome calculation is 0, this indicates that the signal has not been contaminated (i.e., the received signal is correct). Otherwise, processing in stages 12 to 14 must be continued. In stage 12, a Berlekamp-Massey algorithm is used to calculate an error location polynomial. In stage 13, a Chien search is conducted according to the error location polynomial to find at least one error evaluation value. The error evaluation value can be used to confirm the location of the error. In stage 14, at least one error value is found, and the error value is subtracted at an appropriate error location so as to recover the correct signal.

In general, a Reed-Solomon block code is represented by Reed-Solomon (n,k), where n represents the total number of symbols of each block after encoding, k represents the number of source message symbols of each encoded block, and t=(n-k)/2, t representing the maximum number of correctable errors. For example, a digital video broadcasting (DVB) system of the European specification adopts Reed-Solomon (204,188). That is, there are altogether 204 symbols in the Reed-Solomon block code, the number of encoded source message symbols is 188, and the maximum number of correctable errors is 8.

Suppose the Reed-Solomon block code received is as expressed in the following Equation (1):

$$r = r_0 + r_1 + r_2 + \ldots + r_i + \ldots + r_{a-1} \quad (1)$$

where i is a symbol index, and $r_i$ represents the $i^{th}$ symbol in the Reed-Solomon block code.

Using the Berlekamp-Massey algorithm, the number of symbols in which errors occur, and an error location polynomial can be found. Supposing there are altogether d symbols in which errors occur, the error location polynomial thus calculated is as expressed in the following Equation (2):

$$\Lambda(\alpha^i) = \lambda_0 + \lambda_1 \alpha^1 + \lambda_2 \alpha^{2i} + \lambda_3 \alpha^{3i} + \ldots + \lambda_d \alpha^{di} \quad (2)$$

where $d \leq t$.

For each symbol $r_i$, a corresponding error evaluation value $\Lambda(\alpha^i)$ is calculated. The calculation is expressed in the following Equation (3):

$$\Lambda(\alpha^0) = \lambda_0 + \lambda_1 \alpha^0 + \lambda_2 \alpha^0 + \lambda_3 \alpha^0 + \cdots + \lambda_d \alpha^0 \quad (3)$$

$$\Lambda(\alpha^1) = \lambda_0 + \lambda_1 \alpha^1 + \lambda_2 \alpha^2 + \lambda_3 \alpha^3 + \cdots + \lambda_d \alpha^d$$

$$\vdots$$

$$\Lambda(\alpha^{n-1}) = \lambda_0 + \lambda_1 \alpha^{n-1} + \lambda_2 \alpha^{2n-2} + \lambda_3 \alpha^{3n-3} + \cdots + \lambda_d \alpha^{d(n-1)}$$

If the error evaluation value $\Lambda(\alpha^i)$ thus calculated is 0, this indicates that an error has occurred in the symbol $r_i$. Otherwise, this indicates that the symbol $r_i$ is correct.

Since the principles of encoding and decoding in the Reed-Solomon code and the finite field operations are constructed on the Galois field $GF(2^m)$, where ($2^m$) represents the total number of corresponding elements in the Galois field, the finite field operation for the error evaluation value $\Lambda(\alpha^i)$ in Equation (3) herein is a Galois field operation.

The preferred embodiment of an efficient Chien search method in Reed-Solomon decoding of the present invention can be accomplished using a software program. Therefore, in the present invention, a plurality of instructions are written using a programming language and are stored in a machine-readable recording medium. When the instructions are loaded into a processor having a parallel processing instruction set, the processor can be used to execute the method of the present invention.

In the preferred embodiment, the method is executed in an x86 processor having a SSE2 instruction set. However, the method can also be executed in a digital signal processor (DSP), a general purpose processor, or a central processing unit (CPU) having a similar parallel processing instruction set. Thus, implementation of the present invention should not be limited to the preferred embodiment illustrated herein.

Referring to FIG. 3, an efficient Chien search method in Reed-Solomon decoding of the present invention includes the following steps.

In step 31, a location index j is initialized to 0, i.e., j=0, and the symbol index i is initialized to 0, i.e., i=0.

In step 32, according to Equation (3), the error evaluation value $\Lambda(\alpha^i)$ is found. In the preferred embodiment, p entries of error evaluation values $\Lambda(\alpha^i) \sim \Lambda(\alpha^{i+(p-1)})$ are calculated in a single operation using the parallel processing instruction set to perform a vector finite field operation. As techniques relating to vector finite field operations are not crucial features of the present invention, they will not be discussed herein for the sake of brevity. Furthermore, since the p entries of error evaluation values $\Lambda(\alpha^i) \sim \Lambda(\alpha^{i+(p-1)})$ can also be obtained through look-up tables disclosed in the prior art (such as U.S. Pat. No. 6,263,470 and U.S. Pat. No. 6,360,348 mentioned hereinabove), implementation of the present invention should not be limited to the preferred embodiment as illustrated herein.

In step 33, the error evaluation value $\Lambda(\alpha^i)$ is subjected to mapping processing to obtain an index adjusting value $e_i$. That is, if the error evaluation value $\Lambda(\alpha^i)$ is 0, the index adjusting value $e_i$ is 1, and is 0 if otherwise, as expressed in the following Equation (4):

$$\forall \Lambda(\alpha^i) = 0 : e_i = 1$$

$$\forall \Lambda(\alpha^i) \neq 0 : e_i = 0 \quad (4).$$

Figure 4:
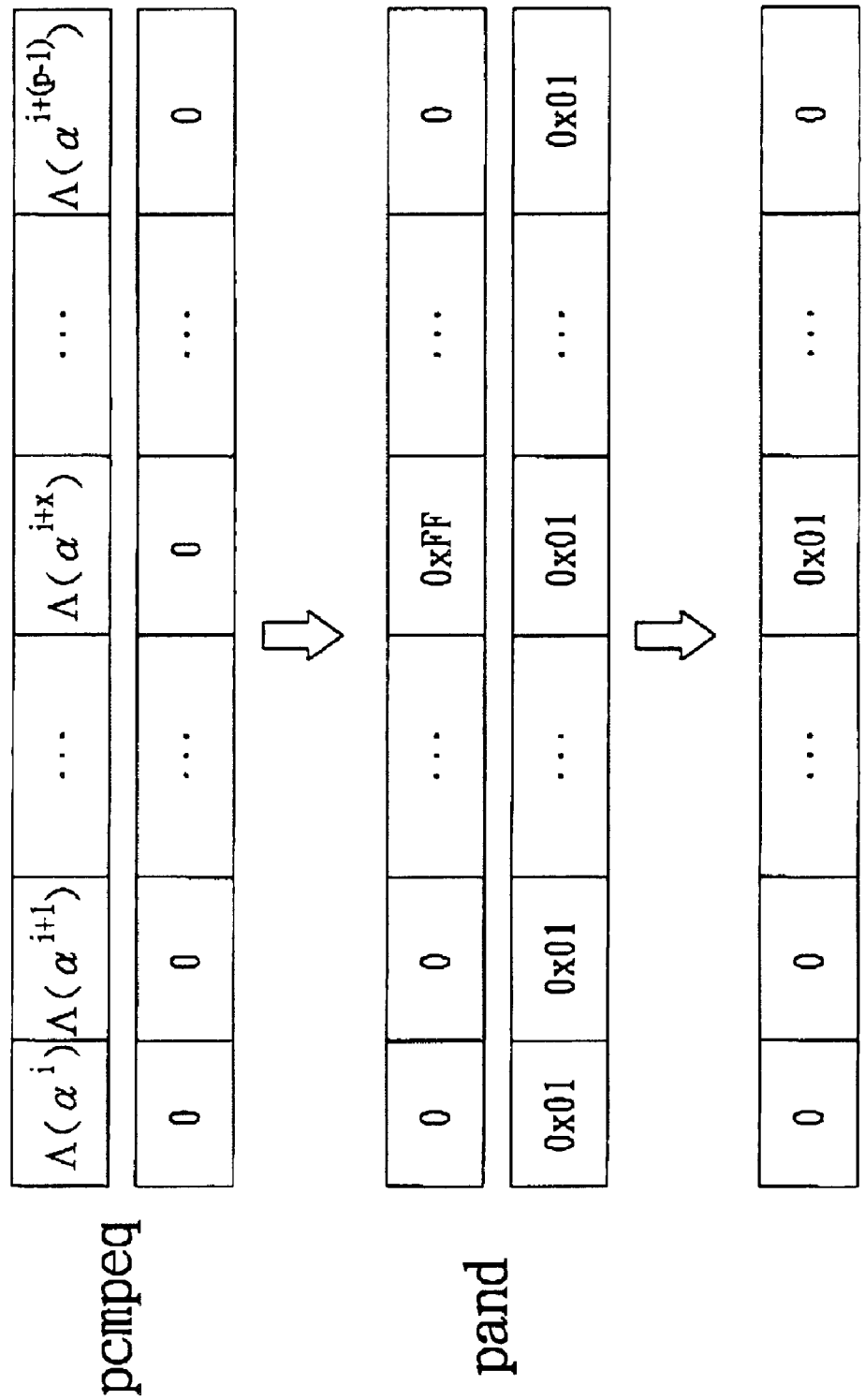
FIG. 4 is a schematic diagram to illustrate mapping processing in the preferred embodiment.

In the preferred embodiment, p entries of error evaluation values $\Lambda(\alpha^i) \sim \Lambda(\alpha^{i+(p-1)})$ are mapped in a single operation using the parallel processing instruction set. Using the SSE2 parallel processing instruction set of the x86 processor as an example, the p(p=16) entries of error evaluation values $\Lambda(\alpha^i) \sim \Lambda(\alpha^{i+(p-1)})$ are each compared with 0 at the same time using a pcmpeqb instruction, where if a certain error evaluation value $\Lambda(\alpha^{i+x})$ is 0, $\Lambda'(\alpha^{i+x})$ is equal to 0xFFh (hexadecimal); otherwise, $\Lambda'(\alpha^{i+x})$ is equal to 0. Thereafter, a pand instruction is used to perform an AND operation of each of the p entries of error evaluation values $\Lambda'(\alpha^i) \sim \Lambda'(\alpha^i)$ and 0x01h. As shown in FIG. 4, as a result of the pcmpeqb and pand instructions, p entries of index adjusting values $e_i \sim e_{i+(p-1)}$ can be obtained.

Referring to FIG. 3, in step 34, the symbol index i is stored in an error location memory corresponding to the location index j. The error location memory is actually an array, and is assumed to be Location[1×d]. Thus, the processing in step 34 can be expressed as Location[j]=i.

In step 35, the index adjusting value $e_i$ is added to the location index j, so as to update the location index j, i.e., $j=j+e_i$.

In step 36, the symbol index i is updated, i.e., i=i+1.

It should be noted that, in this preferred embodiment, the p entries of index adjusting values $e_i \sim e_{i+(p-1)}$ are subjected to the processing in steps 34 to 36 in sequence. In other words, after completing the processing in step 33, the processing in steps 34 to 36 is performed in sequence p times. When $e_i=0$, this indicates that the symbol index i will be put in the same memory location, and this is the so-called memory in place technique.

In steps 37 to 38, a decision is performed to determine if the Chien search has been completed. If yes, the flow is ended. Otherwise, steps 32 to 36 are repeated. The number of times steps 32 to 36 are repeated depends on the total number n of symbols in the Reed-Solomon block code. After all the symbols in the Reed-Solomon block code have been processed (when i=n−1), this indicates that the Chien search has been completed.

Figure 2:
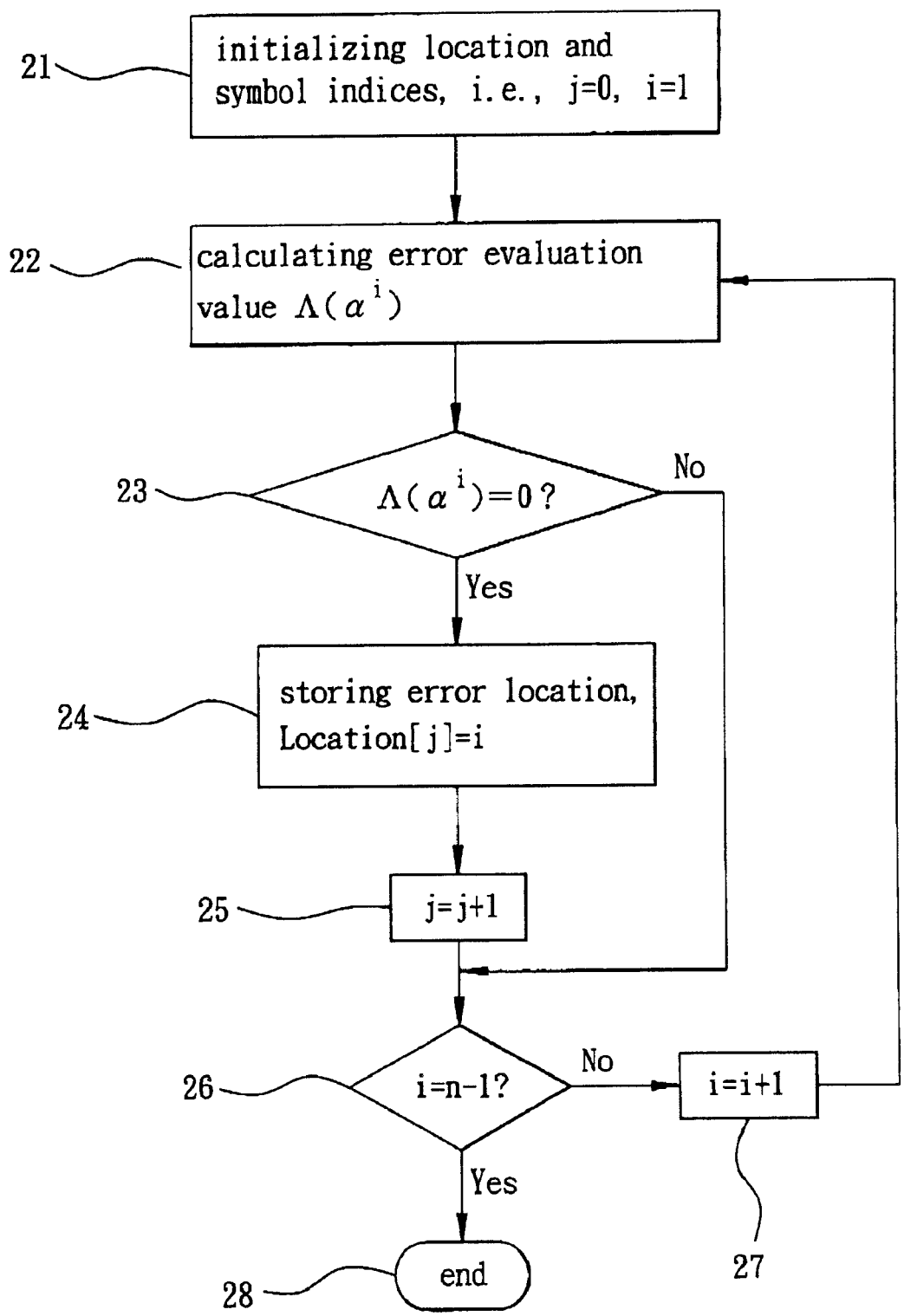
FIG. 2 is a flowchart to illustrate a conventional Chien search method in Reed-Solomon decoding.

Referring back to FIG. 2, by utilizing mapping processing of the error evaluation value $\Lambda(\alpha^i)$ and the memory in place technique, the present invention can help avoid program flow branching as a result of the processing in step 23 of the conventional method.

In sum, since the method of the present invention can eliminate the program flow branching problem associated with the Chien search, reduce disordered execution of the processor, and enhance utilization efficiency of the pipeline of the processor, the processing time of the Chien search can be further reduced to successfully increase the decoding speed of the Reed-Solomon code.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. An efficient Chien search method in Reed-Solomon decoding, which is adapted to be implemented in a processor having a parallel processing instruction set, the efficient Chien search method comprising the following steps:
    (a) calculating an error evaluation value;
    (b) subjecting the error evaluation value to mapping processing so as to find an index adjusting value;
    (c) storing a symbol index into an error location memory corresponding to a location index;
    (d) updating the location index according to the index adjusting value;
    (e) updating the symbol index; and
    (f) repeating steps (a) to (e) a particular number of times.

2. The efficient Chien search method according to claim 1, wherein the particular number of times is determined by a total number of symbols in a received Reed-Solomon block code.

3. The efficient Chien search method according to claim 2, wherein, in step (b), the index adjusting value is 1 if the error evaluation value is 0, and the index adjusting value is 0 if otherwise.

4. The efficient Chien search method according to claim 3, wherein, in step (d), the index adjusting value is added to the location index so as to update the location index.

5. The efficient Chien search method according to claim 1, wherein, in step (b), the error evaluation value is subjected to mapping processing by means of the parallel processing instruction set so as to find the index adjusting value.

6. A machine-readable recording medium, which includes a plurality of instructions, the instructions being used to execute the following steps in a processor having a parallel processing instruction set:
    (a) calculating an error evaluation value;
    (b) subjecting the error evaluation value to mapping processing so as to obtain an index adjusting value;
    (c) storing a symbol index into an error location memory corresponding to a location index;
    (d) updating the location index according to the index adjusting value;
    (e) updating the symbol index; and
    (f) repeating steps (a) to (e) a particular number of times.

7. The machine-readable recording medium according to claim 6, wherein the particular number of times is determined by a total number of symbols in a received Reed-Solomon block code.

8. The machine-readable recording medium according to claim 7, wherein, in step (b), the index adjusting value is 1 if the error evaluation value is 0, and the index adjusting value is 0 if otherwise.

9. The machine-readable recording medium according to claim 8, wherein, in step (d), the index adjusting value is added to the location index so as to update the location index.

10. The machine-readable recording medium according to claim 6, wherein, in step (b), the error evaluation value is subjected to mapping processing by means of the parallel processing instruction set so as to find the index adjusting value.

* * * * *